(12) United States Patent
Jagannathan et al.

(10) Patent No.: US 11,519,960 B2
(45) Date of Patent: Dec. 6, 2022

(54) CIRCUIT CONFIGURED TO DETERMINE A TEST VOLTAGE SUITABLE FOR VERY LOW VOLTAGE (VLV) TESTING IN AN INTEGRATED CIRCUIT

(71) Applicant: NXP USA, Inc., Austin, TX (US)

(72) Inventors: Srikanth Jagannathan, Austin, TX (US); Kumar Abhishek, Bee Cave, TX (US); Gayathri Bhagavatheeswaran, Austin, TX (US)

(73) Assignee: NXP USA, Inc., Austin, TX (US)

( * ) Notice: Subject to any disclaimer, the term of this patent is extended or adjusted under 35 U.S.C. 154(b) by 188 days.

(21) Appl. No.: 16/999,153

(22) Filed: Aug. 21, 2020

(65) Prior Publication Data

US 2022/0057448 A1    Feb. 24, 2022

(51) Int. Cl.
*G01R 31/3177* (2006.01)
*G01R 31/28* (2006.01)

(52) U.S. Cl.
CPC ..... *G01R 31/3177* (2013.01); *G01R 31/2851* (2013.01)

(58) Field of Classification Search
CPC ............ G01R 31/3177; G01R 31/2851; G01R 31/31715; G01R 31/3004
See application file for complete search history.

(56) References Cited

U.S. PATENT DOCUMENTS

| | | | |
|---|---|---|---|
| 5,029,272 A * | 7/1991 | Fourcroy | H03K 5/135 327/31 |
| 6,128,757 A | 10/2000 | Yousuf et al. | |
| 6,954,705 B2 | 10/2005 | Benware | |
| 7,667,522 B1 * | 2/2010 | Maung | H03K 19/018528 326/62 |
| 2007/0046342 A1* | 3/2007 | Morino | H03K 17/22 327/143 |
| 2019/0288689 A1* | 9/2019 | Jain | G06F 13/4068 |

\* cited by examiner

*Primary Examiner* — Feba Pothen

(57) ABSTRACT

An integrated circuit device includes general purpose input/output (I/O) circuitry having a transmit level shifter circuit in a transmit I/O circuit and a receive level shifter circuit in a receive I/O circuit. The integrated circuit device also includes an I/O pad which couples an output of the transmit level shifter circuit to an input of the receive level shifter circuit, a counter circuit, an inverter circuit coupled between the receive level shifter circuit and the counter circuit, and a logic gate. The logic gate includes a first input coupled to an output of the inverter circuit, a second input coupled to a counter_done signal from the counter circuit, and an output coupled to provide a data_out signal to an input of the transmit level shifter circuit.

20 Claims, 4 Drawing Sheets

CIRCUIT CONFIGURED TO DETERMINE A TEST VOLTAGE SUITABLE FOR VERY LOW VOLTAGE (VLV) TESTING IN AN INTEGRATED CIRCUIT

BACKGROUND

Field

This disclosure relates generally to integrated circuits, and more specifically, to a circuit configured to determine a test voltage suitable for very low voltage (VLV) testing of an integrated circuit.

Related Art

Integrated circuits (ICs) need to be tested for basic functionality and retention at very low voltages to identify weak areas of the integrated circuit design during production. In current VLV testing, the operating voltage is typically set to 80% of the core operating voltage. For example, for a core voltage of 0.8V, VLV testing is performed at about 0.64V. However, as the expectation for defectivity is pushed lower (such as to the order of less than 1 parts per million (PPM)), it is desirable to run the VLV tests at even lower operating voltages, but while some ICs can be tested at these lower voltages to identify more defectivity, other ICs are unable to operate and be tested at these lower voltages. Therefore, a need exists for improved VLV testing for an IC to achieve reduced levels of defectivity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, in a system on a chip (SoC), a testing circuit is used in combination with the level shifters of a general purpose input/output (GPIO) circuit of the SoC and an external pad of the SoC to determine a minimum value of the supply voltage at which both the logic and the level shifters can properly operate. This minimum value can then be used as the test voltage to power the SoC for very low voltage (VLV) testing. This minimum value can be less than 80% of the core voltage, which may allow for the ability to identify more weak parts during production as compared to using the typical test voltage of 80% of the core supply voltage for VLV testing. In one embodiment, the level shifters and the external pad of the SoC, in combination with elements of the test circuit configured for test mode, form a ring oscillator. The supply voltage of the SoC is ramped up from zero until it reaches a voltage level sufficient for both the logic and the level shifters to operate (in which the level shifters typically require a higher supply voltage to operate as compared to the logic). As a result of the logic and level shifters becoming operational, the ring oscillator becomes operational. In one embodiment, a counter is used to determine when a predetermined number of signal transitions has occurred at a particular node of the ring oscillator. Upon the ring oscillator reaching the predetermined number of signal transitions, the voltage on the external pad of the SoC can be pulled down to zero by the test circuit, at which point the corresponding voltage level of the supply voltage can be recorded as the minimum supply voltage needed for both the logic and GPIOs to be sufficiently operational. This minimum supply voltage can then be used to perform VLV testing on the SoC. Note that by determining the minimum supply voltage in this manner, it is possible that the minimum supply voltage is determined to be less than 80% of the core voltage supply which may allow for improved VLV testing and thus improved defect coverage.

Figure 1:
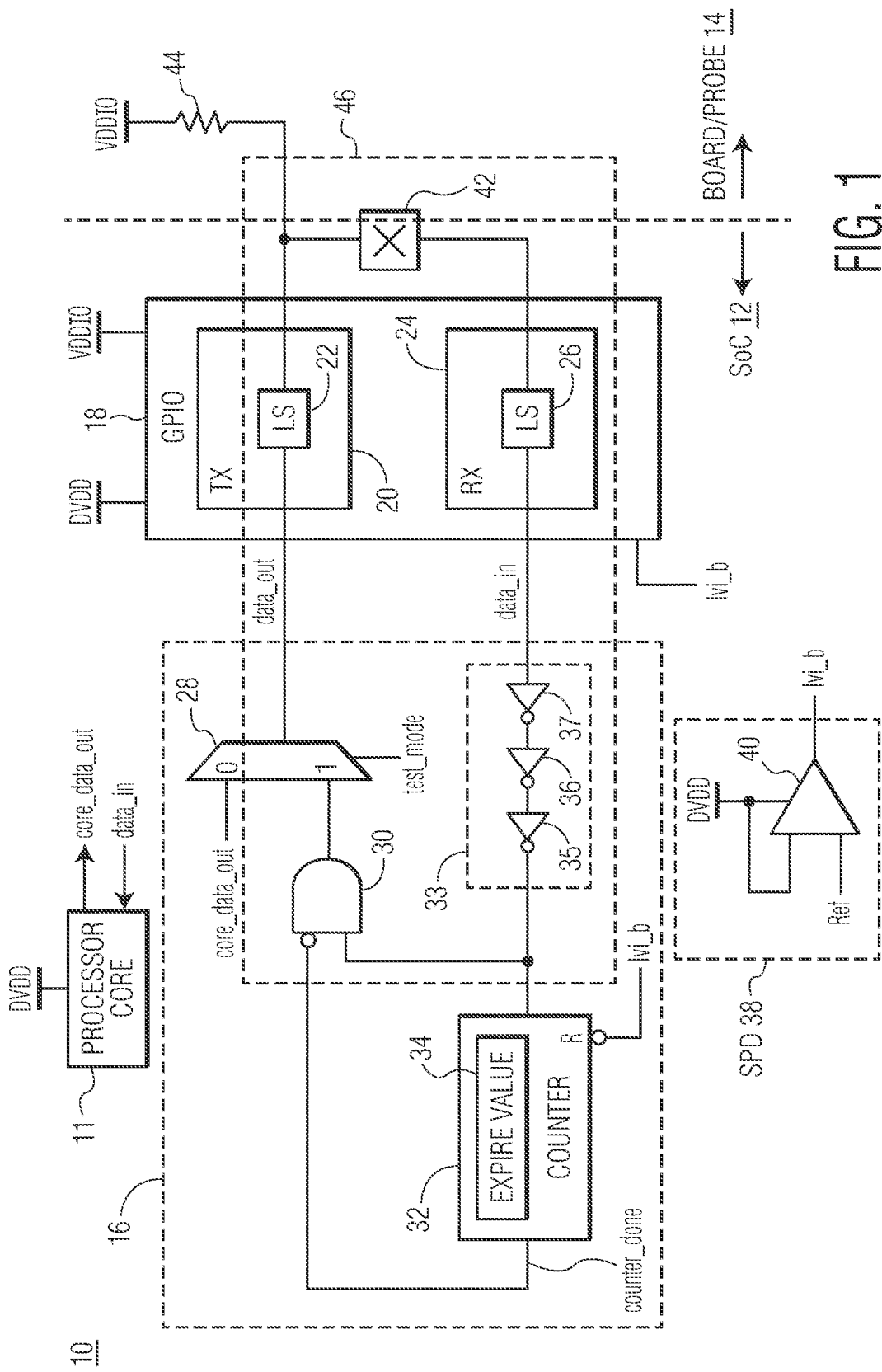
FIG. 1 illustrates, in block diagram form, a system including a system on a chip (SoC) having an external terminal, in accordance with one embodiment of the present invention.

FIG. 1 illustrates a system 10 includes a system on a chip (SoC) 12 coupled to a circuit board 14. (Note that board 14 may instead be a probe station at which SoC 12 is being tested.) SoC 12 includes a processor core 11, a test circuit 16, a general purpose I/O circuit (GPIO) 18, a supply voltage presence detector circuit (SPD) 38, and an external terminal 42 (also referred to as an I/O pad or pin). SoC 12 may include many other elements, as known in the art, but are not illustrated in FIG. 1 for simplicity. For example, SoC 12 may include any number of cores, a system interconnect, one or more peripherals, etc. Board 14 has access to external terminal 42, and includes a pull-up resistor 44 coupled to external terminal 42.

GPIO 18 is coupled to a first power supply terminal which is coupled to provide a first supply voltage, DVDD, and a second power supply terminal which is coupled to provide a second supply voltage, VDDIO. Therefore, the first power supply terminal may be referred to herein as DVDD, and the second power supply terminal as VDDIO. In one embodiment, DVDD is provided to a core (e.g. processor core 11) of SoC 12 and is referred to as a core voltage. In one embodiment, VDDIO is the voltage at which SoC 12 interfaces with components external to SoC 12 via its external terminals (e.g. external terminal 42), and may be greater than DVDD. GPIO 18 includes a transmit circuit (TX) 20 and a receive circuit (RX) 24, such that TX 20 provides an output signal to terminal 42, and RX 24 receives an input signal from terminal 42. TX 20 includes a level shifter circuit (LS) 22 which translates signals received at LS 22 from a first voltage domain powered by DVDD to a second voltage domain powered by VDDIO, such that transmitted signals by terminal 42 are in the second power domain. RX 24 includes a level shifter circuit (LS) 26 which translates signals received at LS 26 from the second voltage domain to the first voltage domain. Therefore, level shifters 22 and 26 interface between signals within SoC 12 and external signals transmitted or received at terminal 42. Note that if the first and second power domain have the same voltage levels, the level shifters may not be required. Also, external terminal 42 is coupled via pull-up resistor 44 to VDDIO, which in one embodiment, is a weak pull-up resistor which can be overcome by TX 20 when controlled by test circuit 16 (discussed further below).

SPD 38 includes a comparator 40 which is coupled to the first power supply terminal. Comparator 40 is both powered by DVDD and has a first input coupled to receive DVDD. Comparator 40 has a second input coupled to receive a reference voltage (REF), and an output to provide an active low "low voltage inhibit" signal, lvi_b (in which the "_b" denotes the signal as active low). SPD 38 indicates when a supply voltage (DVDD, in this case) has reached a voltage level sufficient for the logic of SoC 12 to operate. The logic includes digital logic elements such as counters, logic gates, etc. Therefore, in the illustrated embodiment, REF is set to the minimum voltage required for the logic to operate, such that, upon SoC 12 being powered up, prior to DVDD reaching REF, lvi_b remains a logic level low (e.g. 0) to inhibit operation of the logic, and when DVDD reaches REF, lvi_b transitions to a logic level high (e.g. 1) to indicate DVDD is at a sufficient voltage level for the logic to operate (i.e. the presence of a sufficient supply voltage has been detected). Note that any type of circuitry may be used to implement SPD, in which the output of SPD (e.g. lvi_b) indicates when the supply voltage is detected and sufficient for logic to operate reliably. The signal lvi_b is provided to both GPIO 18 and counter circuit 32. In one embodiment, upon lvi_b transitioning from a logic level low to a logic level high, level shifters 22 and 26 are enabled (although they may not yet be able to operate properly).

Test circuit 16 (which may also be referred to as a VLV test voltage determination circuit) includes a MUX 28, a counter circuit 32, an inverter circuit 33, and an AND gate 30. A first data input of MUX 28 is coupled to receive core_data_out, which is output data provided from core 11 (or any core) of SoC 12. A second data input of MUX 28 is coupled to an output of AND gate 30, and a control input of MUX 28 is coupled to receive a test_mode signal. During normal operation of SoC 12, and thus not in test mode, test_mode is negated to a logic level zero in which MUX 28 provides core_data_out as its output, data_out. When SoC 12 is in test mode, test_mode is asserted to a logic level one in which MUX 28 provides the output of AND gate 30 as its output data_out. LS 22 in TX 30 has an input coupled to receive data_out and an output coupled to external terminal 42. An input of LS 26 in RX 24 is coupled to external terminal 42, and an output of LS 26 provides data_in to an input of inverter circuit 33 which operates to delay and invert the value of data_in at its output. In the illustrated embodiment, inverter circuit 33 includes series connected inverters 35, 36, and 37. In alternate embodiments, inverter circuit 33 may include any odd number of series connected inverters. Alternatively, inverter circuit 33 may include any combination of logic elements which operates to delay and invert the value of data_in. The output of inverter circuit 33 is coupled to a clock input of counter 32 and to a non-inverting input of AND gate 30. Data_in can also be coupled to any circuitry within SoC 12 such that SoC 12 can use inputs received at external terminal 42 during normal operation. An inverting input of AND gate 30 is coupled to an output, counter_done, of counter 32. (The inverting input of AND gate 30 may be referred to as the first input and the non-inverting input as the second input.)

Counter 32 includes storage circuitry 34 which stores a predetermined expire value. Counter 32 counts active edges on its clock input, and when the count value of counter 32 reaches the expire value, its output, counter_done, is asserted to a logic level high (e.g. one). In the illustrated embodiment, the active edges correspond to rising edges on the clock input, but alternatively, the active edges may correspond to falling edges on the clock input. In yet another embodiment, counter 32 may count each transition (e.g. rising and falling edges) on its clock input (in this case, the expire value can be determined accordingly). Counter 32 also has a reset input, R, coupled to receive lvi_b. Due to the bubble at the reset input, when the reset input receives a logic level low (e.g. zero), counter 32 is reset back to zero. In alternate embodiments, counter 32 may count down instead of count up to assert counter_done upon counting an "expire value" number of active edges (or signal transitions).

In operation, during test mode, SoC 12 is powered up such that DVDD is ramped up from 0V. For test mode operation, test_mode is asserted to a logic level one such that the output of AND gate 30 is provided as data_out to LS 22. In this configuration, TX 20, external terminal 42, RX 24, inverter circuit 33, and AND gate 30 form a ring oscillator 46. As DVDD is ramped up, ring oscillator 46 will start oscillating when DVDD is sufficient for the logic to operate (e.g. including counter 32, AND gate 30, MUX 28, and inverter circuit 33) and is also sufficient to allow the level shifters of GPIO 18 to operate, resulting in a clock signal at the clock input of counter 32. When DVDD is sufficient for the logic to operate, lvi_b transitions to a logic level one, enabling counter 32 to start counting. Upon counter 32 counting a predetermined number of active edges (e.g. rising edges), counter_done is asserted, forcing the output of AND gate 30, and thus data_in, to be held at zero. At the point that data_in is held at zero, DVDD has reached a minimum voltage level at which SoC 12 (including the logic and the GPIOs) is assumed to be reliably operational. This minimum voltage level for DVDD can therefore be used to run VLV tests in SoC 12. This minimum voltage level for DVDD, in many cases, is below 80% of the core voltage level for DVDD, allowing for lower voltage levels than currently used for VLV testing.

Figure 2:
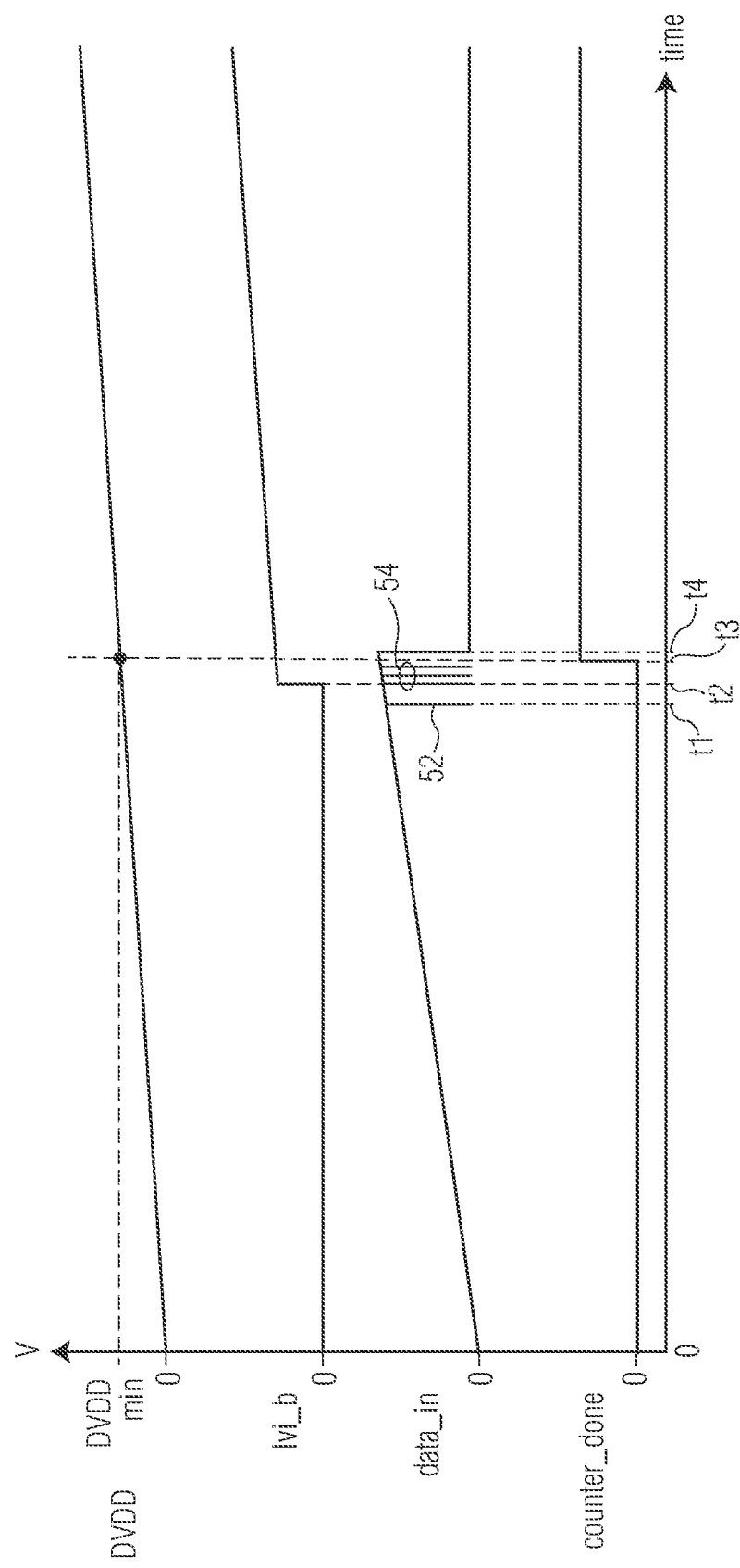
FIG. 2 illustrates a timing diagram of various signals within the SoC of FIG. 1, in accordance with one embodiment of the present invention.

Operation during test mode will be further described in reference to the timing diagram of FIG. 2. SoC 12 can be connected, for example, to automatic test equipment (ATE) which controls DVDD and monitors (e.g. samples) external terminal 42. At time 0, DVDD is ramped up from 0V by the ATE. Since DVDD is not sufficient yet for logic to operate, lvi_b remains asserted at zero to continue to inhibit the logic from operating (which also ensures counter 32 is reset and counter_done remains deasserted at zero). At time t2, DVDD hits a voltage level which triggers SPD 38 to release lvi_b by negating lvi_b to a logic level high, indicating that counter 32, AND gate 30, and inverters 33 are able to operate. When lvi_b transitions to a logic level high, level shifters 20 and 22 are enabled (although they are not yet operational) and counter 32 is enabled to start counting active edges on its clock input. Since counter 32 is not enabled prior to the assertion of lvi_b, any spurious transitions (such as transition 52 in FIG. 2) which propagate to the output of inverter circuit 33 prior to time t2 are not counted by counter 32. (Also, note that starting at time 0, weak pull-up resistor 44 is alive and pulls up external pad 42 until it is overridden when ring oscillator 46 is operational.)

Upon lvi_b transitioning to a logic level high, DVDD continues to ramp up, and once it reaches a level sufficient for the level shifters to operate, data_out is provided by LS 22 to external terminal 42, which is then received by LS 26 and provided as data_in to inverter circuit 33. Data_in propagates through inverters 37, 36, and 35 to provide a delayed and inverted value of the value of data_in to counter 32. The output of inverter circuit 33 is communicated via AND gate 30 and MUX 28 as data_out to LS 22. With the level shifters operational, ring oscillator 46 is operational, such that the signal at LS 22 is again communicated via terminal 42 to LS 26 to produce data_in, in which the output of inverter circuit 33 is toggled. It is assumed that in this example, the expire value of counter 32 is three such that after three rising edges of data_in (represented by transitions 54 in FIG. 2), counter_done is asserted (at time t3). In alternate embodiments, the expire value can be any value, such as, for example, ten or more, and may also depend on whether counter 32 counts only falling edges, only rising edges, or both rising and falling edges.

Prior to time t3, while counter_done is negated at zero due to being held at reset by lvi_b, the first input to AND gate 30 is one (corresponding to the inversion of counter_done). With the first input of AND gate 30 a one, the value at the second input is transferred via MUX 28 as data_out. However, when counter_done is asserted in response to a third active edge from inverter circuit 33, the first input to AND gate 30 becomes a zero. This forces the output of AND gate 30 to be zero and remain zero as counter_done remains asserted. With the output of AND gate 30 a zero, data_out, terminal pad 42, and data_in all become and remain zero as well. Due to the propagation of counter_done through AND gate 30, MUX 28, and level shifters 22 and 26, data_in becomes zero at time t4, which is shortly after counter_done is asserted at time t3. Note that data_in remains zero after time t4. With data_in at zero, pull-up resistor 44 is overcome and external pad 42 is pulled down to zero as well.

With data_in (and thus external pad 42) remaining at zero for more than a predetermined amount of time, it is known that DVDD is both at a sufficient level for the logic to operate and at a sufficient level for the GPIO (e.g. level shifters) to work properly. That is, SPD 38 first releases (i.e. negates) lvi_b to a logic level one, which enables counter 32 so that it can start counting (and enables other logic to operate). Then, once DVDD further increases to the appropriate level, the level shifters begin to operate as part of ring oscillator 46. Therefore, in one embodiment, upon assertion of counter_done, it is assumed that DVDD is at the minimum DVDD voltage level required to properly operate SoC 12 for VLV testing (labeled as DVDD min in FIG. 2). In another embodiment, the minimum level of DVDD is taken at a predetermined amount of time shortly after t3, such as t4, or even later. In one embodiment, the ATE may wait until the voltage level on external pad 42 is 0V for a predetermined amount of time, which may occur shortly after t4. Therefore, at some point after counter 32 reaches its expire value (as indicated by external pad 42 reaching and remaining at zero), the ATE can record the corresponding DVDD value at that point as DVDD min.

Figure 3:
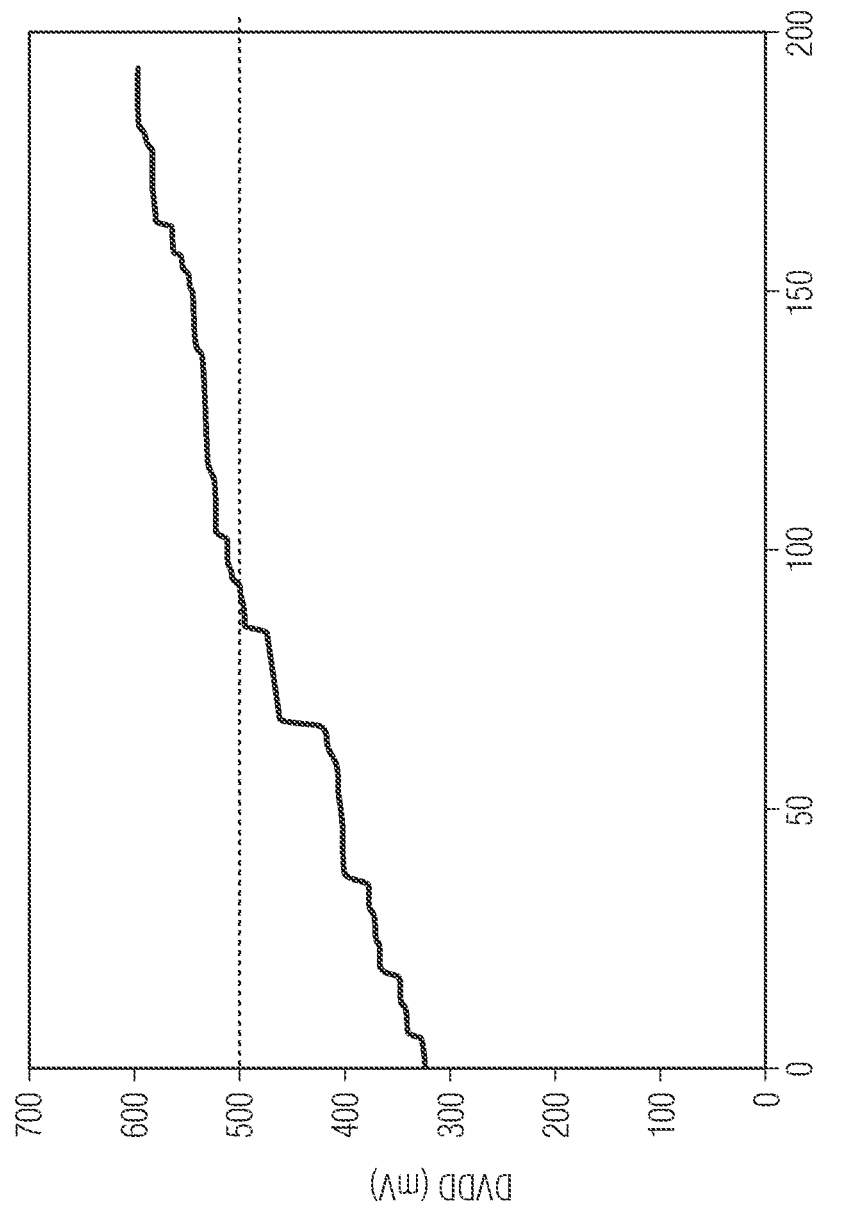
FIG. 3 illustrates an example distribution of various samples and corresponding supply voltage levels.

By using test circuit 16, a minimum DVDD (also referred to as a lowest test voltage level) can be determined to perform VLV testing. In one embodiment, each die on a wafer includes a test circuit like test circuit 16, and an ATE may test each die on a wafer to determine the minimum DVDD at which both the logic and GPIOs work. Furthermore, the ATE can perform the test over a range of process, voltage, and temperature (PVT) parameters, such as at the PVT corners. FIG. 3 illustrates a distribution of samples that have been tested over a range of PVT values, in which each sample (e.g. die) is operated at a given PVT to determine the DVDD. The results for the samples (identified along the x axis of FIG. 3) are then plotted at the determined DVDD min level (along the y axis of FIG. 3) for that sample, in which the results are plotted with increasing DVDD min levels in FIG. 3. In the example that the core voltage is 0.8V, typically VLV testing is done at 80% of the core voltage, which is 0.64 V (or 640 mV). In the example of FIG. 3, all the samples (close to 200 samples) fall below 640 mV, and thus can operate across the tested PVT values at 640 mV. Furthermore, about half the samples could instead be tested at an even lower voltage, 500 mV, as can be seen by nearly half of the samples having a DVDD min value less or equal to 500 mV. Therefore, certain samples (e.g. die) can be powered at a DVDD lower than 80% of the core voltage for VLV testing. This allows for the VLV testing to catch and weed out more defective parts, thus reducing the defectivity to lower a lower PPM.

In one embodiment, the ATE can test each die of each wafer in a wafer lot or multiple lots and determine a min DVDD at which to perform VLV testing for each die. In an alternate embodiment, a representative die can be used for each wafer or for a larger number of die (e.g. multiple wafers) to determine the min DVDD to be used for VLV testing. In another embodiment, each die of a plurality of die is tested and the min DVDD is recorded for each die, and the highest of the recorded min DVDDs is used as the test voltage for every die in the plurality of die for VLV testing.

Figure 4:
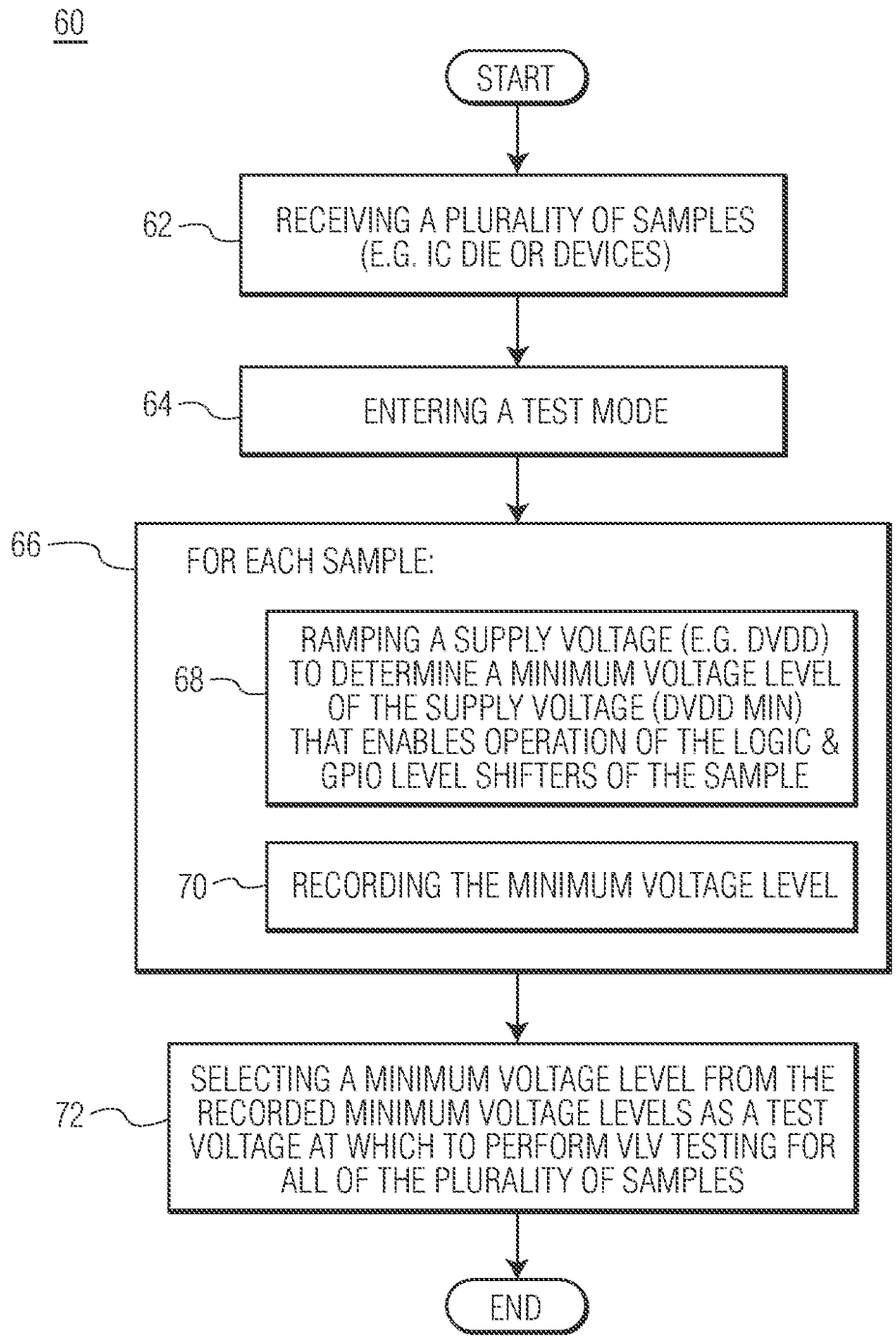
FIG. 4 illustrates, in flow diagram form, a method for determining a supply voltage value for VLV testing.

FIG. 4 illustrates a method 60 for selecting a min DVDD using a test circuit such as test circuit 16. Method 60 may be implemented, for example, by an ATE, which may use probe 14 to access and monitor external pad 42 to determine the min DVDD values. Method 60 begins with block 62 in which a plurality of samples is received for testing. Each sample can be, e.g., an IC device or an IC die, and may be located on a single wafer or multiple wafers. At block 64, test mode is entered for the samples (e.g. the test_mode input signal to MUX 28 is asserted). In one embodiment, the test_mode signal is connected to a pin and directly received from the ATE. For each received sample, at block 66, a supply voltage (e.g. DVDD) is ramped up in block 68 to determine a minimum voltage level of the supply voltage (e.g. DVDD min) that enables operation of the logic and GPIO level shifters of the sample, and at block 70, this determined minimum voltage level is recorded. Note that in block 66, the ATE can determine DVDD min for each sample by monitoring the external pin used by the test circuit (e.g. external pin 42 used by test circuit 16) to determine when it goes to zero and remains at zero. The point at which this is observed on the external pin, the corresponding DVDD value can be recorded as DVDD min (in block 70). After recording the DVDD min for each sample, at block 72, a minimum voltage level (a DVDD min) is selected from all the recorded DVDD min values. In one embodiment, the maximum DVDD value is selected. This selected DVDD min value is then used as a test voltage (i.e. test power supply voltage) at which to perform VLV testing on all of the samples of the plurality of samples (received at block 62). Alternatively, each recorded DVDD min for a sample can be used as the test voltage to perform VLV testing on that sample. Furthermore, different DVDD min values can be stored per sample at different PVT criteria. For example, a lower DVDD min value may be selected for testing at higher temperatures.

Therefore, by now it can be appreciated how a test circuit in combination with a supply voltage detection circuit can be used to determine a minimum supply voltage necessary for both the logic and the GPIOs of an IC to work. This determined voltage can then be used as the test supply voltage to perform VLV testing. By using a supply voltage that is even lower than the typical 80% of the core supply voltage for VLV testing, improved defect coverage can be achieved by weeding out more parts (e.g. weaker parts) as defective during production, allowing for lower defectivity rates after production.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a "_b" following the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely examples, and that in fact many other architectures can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, counter 32 may monitor other nodes of ring oscillator 42 to obtain its count of edges. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

An integrated circuit device includes general purpose input/output (I/O) circuitry including a transmit level shifter circuit in a transmit I/O circuit and a receive level shifter circuit in a receive I/O circuit; an I/O pad coupling an output of the transmit level shifter circuit to an input of the receive level shifter circuit; a counter circuit; an inverter circuit coupled between the receive level shifter circuit and the counter circuit; and a logic gate including a first input coupled to an output of the inverter circuit, a second input coupled to a counter_done signal from the counter circuit, and an output coupled to provide a data_out signal to an input of the transmit level shifter circuit. In one aspect, during a test mode, a supply voltage to the transmit level shifter and receive level shifter circuits is ramped up over time; when the supply voltage reaches a lowest level of voltage that enables operation of the counter circuit, the inverter circuit, and the logic gate circuits, the transmit level shifter circuit outputs a transmit signal to the receive level shifter circuit through the I/O pad, a data input signal output by the receive level shifter circuit is provided as input to the inverter circuitry, the output of the inverter circuit is provided as input to the counter circuit and the logic gate, the logic gate outputs a data output signal to the transmit level shifter circuit, the counter circuit changes a counter value when the output of the inverter circuit changes value, and when the counter value in the counter circuit reaches a specified value, the counter circuit asserts the counter_done signal. In another aspect, the integrated circuit device further includes a pull-up resistor connected between an I/O supply voltage terminal and the I/O pad. In another aspect, the integrated circuit device further includes a supply voltage present detect circuit with a first input connected to the supply voltage, a second input connected to a reference voltage, and an output that provides a low voltage indicator that indicates when the supply voltage is above or below the reference voltage. In a further aspect, the reference voltage is a lowest level of voltage that enables operation of the counter circuit, the inverter circuit, and the logic gate. In yet a further aspect, the low voltage indicator is used by the counter circuit to reset the counter value when the low voltage indicated signal is a first value and to change the counter value when the low voltage indicated signal is a second value. In another aspect of the above embodiment, the integrated circuit device further includes a multiplexer with a control input coupled to a test mode signal, a first input coupled to the output of the logic gate, a second input coupled to a core data output signal, and an output coupled to provide the data output signal to the input of the transmit level shifter circuit. In another aspect, the integrated circuit device further includes a first inverter device having an input connected to the data input signal and an output connected to an input of a second inverter device; the second inverter device having an output connected to an input of a third inverter device; the third inverter device having an output that provides the output of the inverter circuit. In another aspect, the logic gate is a AND gate having the first input receiving the counter_done signal being an inverting input.

In another embodiment, a method of determining a lowest test voltage level for two or more integrated circuit devices includes, during a test mode, ramping a supply voltage to increasing values. When the supply voltage reaches a lowest level of voltage that enables operation of transmit level shifter and receive level shifter circuits in the two or more integrated circuit devices, for each of the integrated circuit devices, the method includes using output from the transmit level shifter circuit as input to the receive level shifter circuit, toggling output from the received level shifter circuit by inverting the output from the receive level shifter circuit, providing the inverted output from the receive level shifter circuit as input to the transmit level shifter circuit, and recording a value of the supply voltage after a specified number of times of toggling the output from the receive level shifter circuit. The method further includes using one of the recorded supply voltages from among the two or more integrated circuit devices as a test voltage for all the two or more integrated circuit devices. In one aspect, the method further includes providing the output from the transmit level shifter circuit through an I/O pad to the receive level shifter circuit. In a further aspect, the method further includes level shifting the transmit signal to a data input signal; providing data input signal as the output from the receive level shifter circuit. In another aspect of the another embodiment, the method further includes providing the inverted output from the receive level shifter circuit to a first input of a logic gate. In a further aspect, the method further includes providing the inverted output from the receive level shifter circuit as the input to the transmit level shifter circuit through the logic gate. In another further aspect, the method further includes providing the supply voltage to general purpose I/O circuitry that includes the transmit level shifter and receive level shifter circuits. In another aspect of the another embodiment, the method further includes pulling up voltage on the I/O pad until the supply voltage reaches a level that enables the operation of the transmit level shifter and receive level shifter circuits.

In yet another embodiment, a processing system includes a processor core; general purpose input/output (GPI/O) circuitry coupled to the processor core, the GPIO circuitry including: transmit circuitry including a transmit level shifter circuit and receive circuitry including a receive level shifter circuit, an input of the receive level shifter circuit coupled to an output of the transmit level shifter circuit; an inverter circuit including an input coupled to an output of the receive level shifter circuit; a counter circuit including an input coupled to an output of the inverter circuit and an output, the counter circuit configured to indicate when the output of the inverter circuit changes value a specified number of times once a supply voltage to the GPIO circuitry reaches a minimum level; and a logic gate including a first input coupled to the output of the counter circuit, a second input coupled to the output of the inverter circuit, and an output coupled to an input of the transmit level shifter circuit. In one aspect, the processing system further includes a multiplexer including a first input connected to a core data out signal from the processor core, a second input connected to the output of the inverter circuit, a control input coupled to a test mode signal, and an output coupled to the input of the transmit level shifter circuit. In another aspect, the processing system further includes an input/output (I/O) pad connected to the output of the transmit level shifter and the receive level shifter circuits; and a pull-up resistor connected to the I/O pad. In yet another aspect, the processing system further includes a supply voltage presence monitor circuit including a first input connected to the supply voltage, a second input connected to a reference voltage, and an output that indicates whether a logic supply voltage reached a minimum level.

What is claimed is:
1. An integrated circuit device comprising:
general purpose input/output (I/O) circuitry, coupled to a supply voltage, including:
a transmit level shifter circuit in a transmit I/O circuit;
a receive level shifter circuit in a receive I/O circuit;
an I/O pad coupling an output of the transmit level shifter circuit to an input of the receive level shifter circuit;
a counter circuit;
an inverter circuit coupled between the receive level shifter circuit and the counter circuit;
a logic gate including a first input coupled to an output of the inverter circuit, a second input coupled to a counter_done signal from the counter circuit, and an output coupled to provide a data out signal to an input of the transmit level shifter circuit, and
a supply voltage present detect circuit with a first input connected to the supply voltage, a second input connected to a reference voltage, and an output that provides a low voltage indicator that indicates when the supply voltage is above or below the reference voltage, wherein the reference voltage is a lowest level of voltage that enables operation of the counter circuit, the inverter circuit, and the logic gate.
2. An integrated circuit device comprising:
general purpose input/output (I/O) circuitry including:
a transmit level shifter circuit in a transmit I/O circuit;
a receive level shifter circuit in a receive I/O circuit;
an I/O pad coupling an output of the transmit level shifter circuit to an input of the receive level shifter circuit;
a counter circuit
an inverter circuit coupled between the receive level shifter circuit and the counter circuit and
a logic gate including a first input coupled to an output of the inverter circuit, a second input coupled to a counter_done signal from the counter circuit, and an output coupled to provide a data_out signal to an input of the transmit level shifter circuit,
wherein during a test mode:
a supply voltage to the transmit level shifter and receive level shifter circuits is ramped up over time;
when the supply voltage reaches a lowest level of voltage that enables operation of the counter circuit, the inverter circuit, and the logic gate circuits,
the transmit level shifter circuit outputs a transmit signal to the receive level shifter circuit through the I/O pad,
a data input signal output by the receive level shifter circuit is provided as input to the inverter circuit,
the output of the inverter circuit is provided as input to the counter circuit and the logic gate, the logic gate outputs the data_out signal to the transmit level shifter circuit, the counter circuit changes a counter value when the output of the inverter circuit changes value, and when the counter value in the counter circuit reaches a specified value, the counter circuit asserts the counter_done signal.

3. The integrated circuit device of claim 1, further comprising:

a pull-up resistor connected between an I/O supply voltage terminal and the I/O pad.

4. The integrated circuit device of claim 2, further comprising:

a supply voltage present detect circuit with a first input connected to the supply voltage, a second input connected to a reference voltage, and an output that provides a low voltage indicator that indicates when the supply voltage is above or below the reference voltage.

5. The integrated circuit device of claim 4, wherein the reference voltage is a lowest level of voltage that enables operation of the counter circuit, the inverter circuit, and the logic gate.

6. The integrated circuit device of claim 1, wherein the low voltage indicator is used by the counter circuit to reset a counter value of the counter circuit when the low voltage indicated signal is a first value and to change the counter value when the low voltage indicated signal is a second value.

7. The integrated circuit device of claim 1, further comprising:

a multiplexer with a control input coupled to a test mode signal, a first input coupled to the output of the logic gate, a second input coupled to a core data output signal, and an output coupled to the input of the transmit level shifter circuit.

8. The integrated circuit device of claim 1, the inverter circuit further comprising:

a first inverter device having an input connected to a data input signal from the receive level shifter circuit and an output connected to an input of a second inverter device;

the second inverter device having an output connected to an input of a third inverter device;

the third inverter device having an output that provides the output of the inverter circuit.

9. The integrated circuit device of claim 1, wherein the logic gate is a AND gate having the first input receiving the counter_done signal being an inverting input.

10. A method of determining a lowest test voltage level for two or more integrated circuit devices, comprising:

during a test mode, ramping a supply voltage to increasing values, when the supply voltage reaches a lowest level of voltage that enables operation of transmit level shifter and receive level shifter circuits in the two or more integrated circuit devices:

for each of the integrated circuit devices, using an output from the transmit level shifter circuit as input to the receive level shifter circuit, toggling an output from the receive level shifter circuit by inverting the output from the receive level shifter circuit, providing the inverted output from the receive level shifter circuit as input to the transmit level shifter circuit, recording a value of the supply voltage after a specified number of times of toggling the output from the receive level shifter circuit; and using one of the recorded supply voltages from among the two or more integrated circuit devices as a test voltage for all the two or more integrated circuit devices.

11. The method of claim 10, further comprising:

providing the output from the transmit level shifter circuit through an I/O pad to the receive level shifter circuit.

12. The method of claim 11, further comprising:

level shifting the output from the transmit level shifter to a data input signal;

providing data input signal as the output from the receive level shifter circuit.

13. The method of claim 10, further comprising:

providing the inverted output from the receive level shifter circuit to a first input of a logic gate.

14. The method of claim 13, further comprising:

providing the inverted output from the receive level shifter circuit as the input to the transmit level shifter circuit through the logic gate.

15. The method of claim 13, further comprising:

providing the supply voltage to general purpose I/O circuitry that includes the transmit level shifter and receive level shifter circuits.

16. The method of claim 11, further comprising:

pulling up voltage on the I/O pad until the supply voltage reaches a level that enables the operation of the transmit level shifter and receive level shifter circuits.

17. A processing system, comprising:

a processor core;

general purpose input/output (GPI/O) circuitry coupled to the processor core, the GPIO circuitry including:

transmit circuitry including a transmit level shifter circuit, receive circuitry including a receive level shifter circuit, an input of the receive level shifter circuit coupled to an output of the transmit level shifter circuit;

an inverter circuit including an input coupled to an output of the receive level shifter circuit;

a counter circuit including a first input coupled to an output of the inverter circuit, a second input, and an output, the counter circuit configured to indicate when the output of the inverter circuit changes value a specified number of times once a supply voltage to the GPIO circuitry reaches a minimum level;

a logic gate including a first input coupled to the output of the counter circuit, a second input coupled to the output of the inverter circuit, and an output coupled to an input of the transmit level shifter circuit; and a supply voltage presence monitor circuit including a first input connected to the supply voltage, a second input connected to a reference voltage which represents the minimum level, and an output connected to the second input of the counter circuit, wherein the supply voltage presence monitor is configured to indicate when the supply voltage has reached the reference voltage, wherein the minimum level is a lowest level of voltage that enables operation of the counter circuit, the inverter circuit, and the logic gate.

18. The processing system of claim 17, further comprising:

a multiplexer including a first input connected to a core data out signal from the processor core, a second input connected to the output of the inverter circuit, a control input coupled to a test mode signal, and an output coupled to the input of the transmit level shifter circuit.

19. The processing system of claim 17, further comprising:
an input/output (I/O) pad connected to the output of the transmit level shifter and the receive level shifter circuits; and
a pull-up resistor connected to the I/O pad.

20. The processing system of claim 17, wherein the first input of the clock circuit is a clock input and the second input of the clock circuit is a reset input.

\* \* \* \* \*